United States Patent
Takenaka et al.

(10) Patent No.: US 10,128,411 B2
(45) Date of Patent: Nov. 13, 2018

(54) LIGHT-EMITTING ELEMENT

(71) Applicant: TOYODA GOSEI CO., LTD., Kiyosu-shi (JP)

(72) Inventors: Yasuhiro Takenaka, Kiyosu (JP); Yoshiki Saito, Kiyosu (JP); Shinichi Matsui, Kiyosu (JP); Daisuke Shinoda, Kiyosu (JP); Hisayuki Miki, Chiba (JP); Hironao Shinohara, Chiba (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/643,355

(22) Filed: Jul. 6, 2017

(65) Prior Publication Data
US 2018/0083164 A1    Mar. 22, 2018

(30) Foreign Application Priority Data
Sep. 21, 2016   (JP) ................. 2016-184861

(51) Int. Cl.
*H01L 29/227*    (2006.01)
*H01L 33/38*     (2010.01)
*H01L 33/32*     (2010.01)

(52) U.S. Cl.
CPC .............. *H01L 33/38* (2013.01); *H01L 33/32* (2013.01)

(58) Field of Classification Search
CPC ............................... H01L 33/32; H01L 33/38
See application file for complete search history.

(56) References Cited

U.S. PATENT DOCUMENTS

| | | | |
|---|---|---|---|
| 7,511,311 B2 | 3/2009 | Kususe et al. | |
| 8,035,118 B2 | 10/2011 | Kususe et al. | |
| 8,330,179 B2 | 12/2012 | Kususe et al. | |
| 8,742,438 B2 | 6/2014 | Kususe et al. | |
| 2008/0251808 A1 | 10/2008 | Kususe et al. | |
| 2011/0278538 A1* | 11/2011 | Ko | H01L 33/20 257/13 |
| 2012/0025256 A1 | 2/2012 | Kususe et al. | |
| 2012/0056152 A1* | 3/2012 | Li | H01L 33/38 257/13 |
| 2013/0193467 A1 | 8/2013 | Kususe et al. | |
| 2017/0236807 A1* | 8/2017 | Hwang | H01L 33/32 257/90 |

FOREIGN PATENT DOCUMENTS

JP    3912219 B2    5/2007

* cited by examiner

*Primary Examiner* — Matthew E Warren
(74) *Attorney, Agent, or Firm* — McGinn I.P. Law Group, PLLC.

(57) ABSTRACT

A light-emitting element includes an n-type semiconductor layer mainly including $Al_xGa_{1-x}N$ ($0.5 \leq x \leq 1$), a p-type semiconductor layer, a light-emitting layer sandwiched between the n-type semiconductor layer and the p-type semiconductor layer, an n-electrode connected to the n-type semiconductor layer, and a plurality of p-electrodes that are connected to the p-type semiconductor layer and are arranged in a dot pattern. An area of the n-electrode is not less than 25% and not more than 50% of a chip area.

20 Claims, 9 Drawing Sheets

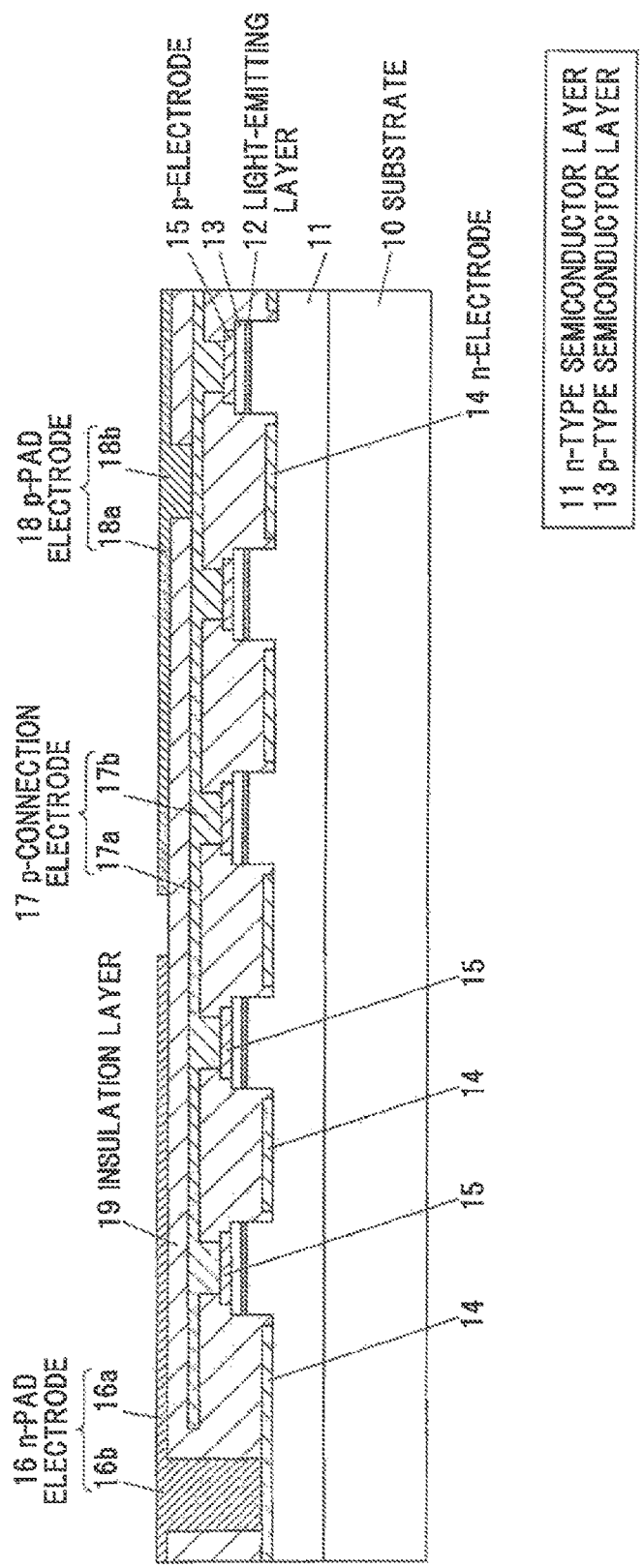

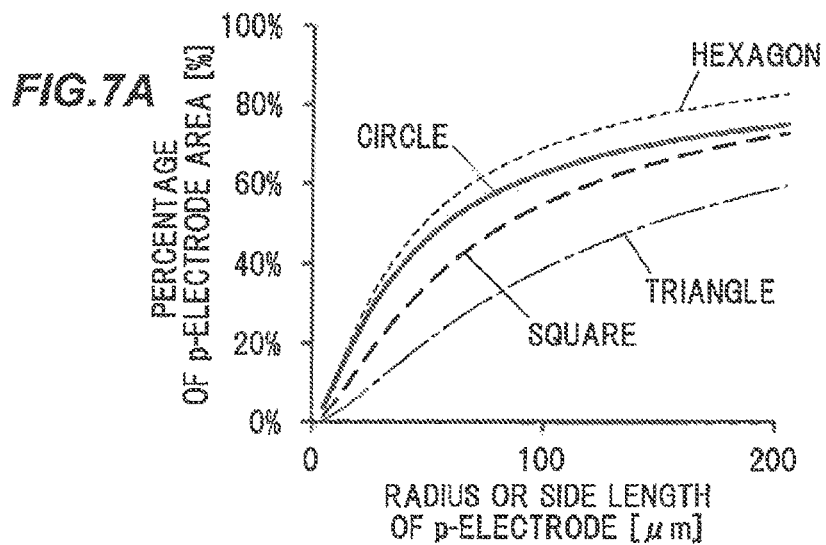
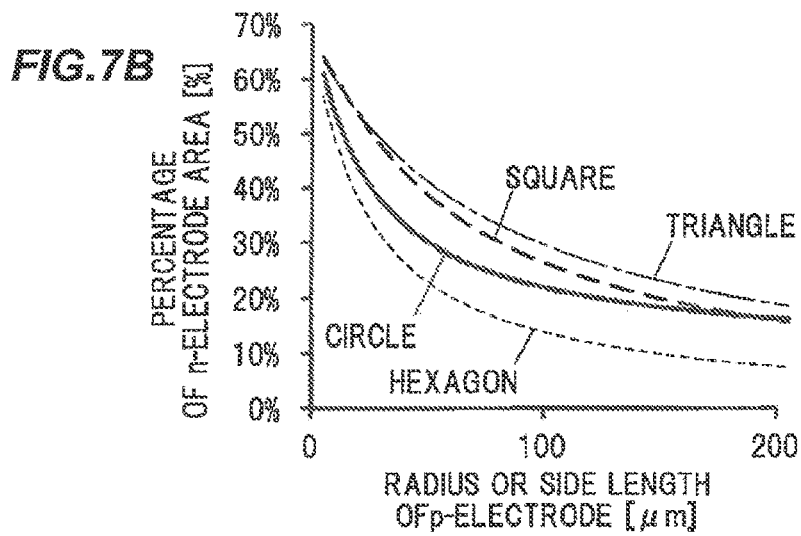
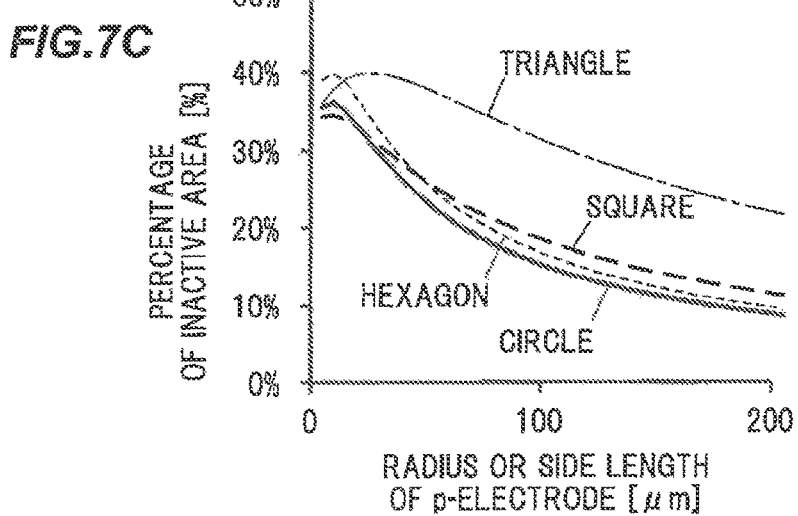

LIGHT-EMITTING ELEMENT

The present application is based on Japanese patent application No. 2016-184861 filed on Sep. 21, 2016, the entire contents of which are incorporated herein by reference.

BACKGROUND OF THE INVENTION

1. Field of the Invention

The invention relates to a light-emitting element and, in particular, to an ultraviolet-light emitting element.

2. Description of the Related Art

A light-emitting element is known in which a light-emitting region is divided into plural portions (see e.g. JP-B-3912219). JP-B-3912219 discloses a light-emitting element that may solve the problem that electric current flow decreases at a portion away from electrodes to cause a decrease in light emission efficiency.

SUMMARY OF THE INVENTION

A light-emitting element, which is formed of a group III nitride semiconductor and emits light in a short wavelength range called UV-B or UV-C, has a semiconductor layer of high Al composition. The light-emitting element may cause the n-type semiconductor layer to have a higher sheet resistance than a light-emitting element which emits a long wavelength light, and may limit the light-emitting layer with sufficient emission intensity only to a region which is close to the n-electrode. In addition, since it has a high contact resistance between the n-type semiconductor layer and the n-electrode, it may have a high forward voltage if the n-electrode thereof was provided with an area equivalent to the light-emitting element which emits the long wavelength light.

It is assumed the light-emitting element disclosed by JP-B-3912219 does not count emission in the UV-B or UV-C wavelength range in view of materials of the semiconductor layer and its emission wavelengths exemplarily mentioned. In addition, JP-B-3912219 is silent to the above problems of the light-emitting element which emits light in the UV-B or UV-C wavelength range.

It is an object of the invention to provide a light-emitting element that prevents a decrease in the light emission efficiency and an increase in the forward voltage due to the composition of the semiconductor layer even when it is configured to emit light in the UV-B or UV-C wavelength range.

According to an embodiment of the invention, a light-emitting element defined by [1] to [10] below is provided.

[1] A light-emitting element, comprising:
an n-type semiconductor layer mainly comprising $Al_xGa_{1-x}N$ ($0.5 \leq x \leq 1$);
a p-type semiconductor layer;
a light-emitting layer sandwiched between the n-type semiconductor layer and the p-type semiconductor layer;
an n-electrode connected to the n-type semiconductor layer; and
a plurality of p-electrodes that are connected to the p-type semiconductor layer and are arranged in a dot pattern,
wherein an area of the n-electrode is not less than 25% and not more than 50% of a chip area.

[2] The light-emitting element according to [1], wherein the n-type semiconductor layer mainly comprises $Al_xGa_{1-x}N$ ($x \geq 0.65$).

[3] The light-emitting element according to [1] or [2], wherein a distance between an edge of the n-electrode and a farthest point on the p-electrodes from the edge of the n-electrode is not more than 100 µm.

[4] The light-emitting element according to any one of [1] to [3], wherein an area of the p-electrodes is not less than 45% of the chip area.

[5] The light-emitting element according to any one of [1] to [4], wherein a planar shape of the p-electrode is a circle or a polygon with not less than four vertices.

[6] The light-emitting element according to [5], wherein the planar shape of the p-electrode is a circle or a hexagon.

[7] The light-emitting element according to any one of [1] to [6], wherein a radius when having a circular shape, or a side when having a polygonal shape, of each p-electrode in the dot pattern is not less than 50 µm.

[8] The light-emitting element according to any one of [1] to [7], wherein a total circumferential length of the p-electrodes is not less than 300 µm.

[9] The light-emitting element according to any one of [1] to [8], wherein the light-emitting layer and the p-type semiconductor layer are laminated on a raised portion of the n-type semiconductor layer that protrudes from a surface connected to the n-electrode, and
wherein a side surface of a laminated portion comprising the raised portion of the n-type semiconductor layer, the light-emitting layer and the p-type semiconductor layer is inclined at an angle of not less than 75° and not more than 90°.

[10] A light-emitting element, comprising:
an n-type semiconductor layer mainly comprising $Al_xGa_{1-x}N$ ($0.5 \leq x \leq 1$); a p-type semiconductor layer;
a light-emitting layer sandwiched between the n-type semiconductor layer and the p-type semiconductor layer;
an n-electrode connected to the n-type semiconductor layer; and
a plurality of p-electrodes that are connected to the p-type semiconductor layer and are arranged in a dot pattern,
wherein a distance between an edge of the n-electrode and a farthest point on the p-electrodes from the edge of the n-electrode is not more than 100 µm.

EFFECTS OF THE INVENTION

According to an embodiment of the invention, a light-emitting element can be provided that prevents a decrease in the light emission efficiency and an increase in the forward voltage due to the composition of the semiconductor layer even when it is configured to emit light in the UV-B or UV-C wavelength range.

BRIEF DESCRIPTION OF THE DRAWINGS

Next, the present invention will be explained in more detail in conjunction with appended drawings, wherein:

FIG. 1 is a vertical cross-sectional view showing a light-emitting element in an embodiment;

FIG. 7A is a graph showing a relation between a percentage of p-electrode area and a radius or side length of each p-electrode in the dot pattern;

FIG. 7B is a graph showing a relation between a percentage of n-electrode area and a radius or side length of each p-electrode in the dot pattern;

FIG. 7C is a graph showing a relation between a percentage of inactive area and a radius or side length of each p-electrode in the dot pattern;

DETAILED DESCRIPTION OF THE PREFERRED EMBODIMENTS

Embodiment

Figure 2A:
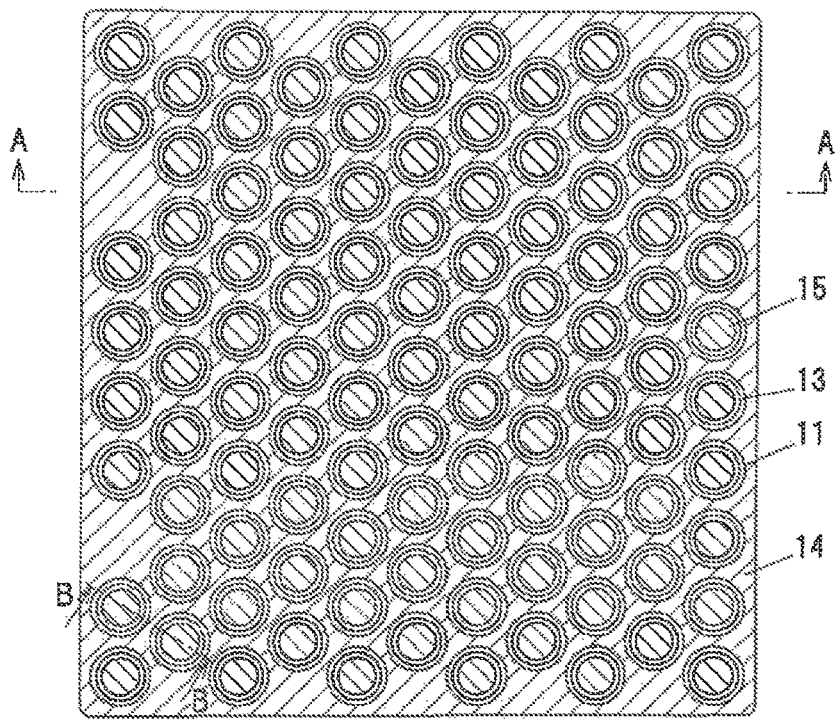
FIG. 2A is a plan view showing an example of a pattern formed of an n-electrode and p-electrodes in the light-emitting element.

FIG. 1 is a vertical cross-sectional view showing a light-emitting element 1 in an embodiment. The light-emitting element 1 emits ultraviolet light in the UV-B wavelength range (315 to 280 nm) or UV-C wavelength range (less than 280 nm). The chip area of the light-emitting element 1 is not less than 0.4 mm² and not more than 25 mm².

The light-emitting element 1 has a substrate 10, an n-type semiconductor layer 11 on the substrate 10, light-emitting layers 12 on the n-type semiconductor layer 11, p-type semiconductor layers 13 on the light-emitting layers 12, an n-electrode 14 connected to the n-type semiconductor layer 11, plural p-electrodes 15 connected to the p-type semiconductor layers 13, an n-pad electrode 16 connected to the n-electrode 14, a p-connection electrode 17 connected to the p-electrodes 15, and a p-pad electrode 18 connected to the p-connection electrode 17.

The light-emitting layers 12, the p-type semiconductor layers 13, the n-electrode 14 and the p-electrodes 15 are located in an insulation layer 19. Meanwhile, the n-pad electrode 16 and the p-pad electrode 18 are exposed on the insulation layer 19.

The substrate 10 is a layer as a base to grow the n-type semiconductor layer 11 and is formed of a transparent material such as sapphire. The light-emitting element 1 is a face-down element of which is light is extracted on the substrate 10 side.

The n-type semiconductor layer 11 is a layer consisting mainly of AlGaN. A donor contained in the n-type semiconductor layer 11 is, e.g., Si.

AlGaN constituting the n-type semiconductor layer 11 has such a composition that the n-type semiconductor layer 11 does not absorb light emitted from the light-emitting layer 12. In detail, the higher the Al composition, the wider the bandgap becomes and absorption of shorter-wavelength light by the n-type semiconductor layer 11 is thus more reduced.

If the emission wavelength of the light-emitting layer 12 is set to be in the UV-B wavelength range, the n-type semiconductor layer 11 may have a composition expressed by $Al_xGa_{1-x}N$ (0.5≤x≤0.65). In this case, the composition of the n-type semiconductor layer 11 is preferably $Al_xGa_{1-x}N$ (0.5≤x≤0.55) since it is easier to grow a high-quality crystal when using AlGaN with lower Al composition.

Also, if he emission wavelength of the light-emitting layer 12 is set to be in the UV-C wavelength range, the n-type semiconductor layer 11 may have a composition expressed by $Al_xGa_{1-x}N$ (0.65≤x≤1). In this case, the composition of the n-type semiconductor layer 11 is preferably $Al_xGa_{1-x}N$ (0.65≤x≤0.7) since it is easier to grow a high-quality crystal when using AlGaN with lower Al composition.

The n-type semiconductor layer 11 includes, e.g., an n-contact layer connected to the n-electrode 14 and an n-cladding layer connected to the light-emitting layer 12. Additionally, a buffer layer may be provided between the substrate 10 and the n-type semiconductor layer 11.

The light-emitting layer 12 is a layer which emits light by recombination of electrons and holes. The light-emitting layer 12 has at least a well layer and a barrier layer. For example, AlGaN layers can be used as the well and barrier layers. In this case, the Al composition is lower in the well layer than in the n-type semiconductor layer 11. The compositional ratio of the well layer and that of the barrier layer are appropriately determined according to the emission wavelength of the light-emitting layer 12. When the emission wavelength of the light-emitting layer 12 is in, e.g., the UV-C wavelength range, the well layer has a composition expressed by $Al_xGa_{1-x}N$ (0.4≤x).

The p-type semiconductor layer 13 is a layer consisting mainly of, e.g., AlGaN. An acceptor contained in the p-type semiconductor layer 13 is, e.g., Mg. The compositional ratio of AlGaN constituting the p-type semiconductor layer 13 is appropriately determined according to the emission wavelength of the light-emitting layer 12.

The p-type semiconductor layer 13 may include, e.g. a p-cladding layer contacting the light-emitting layer 12 and a p-contact layer connected to a transparent electrode.

The n-electrode 14 is a single sheet-shaped electrode and has, e.g. a Ti/Ru/Au/Al laminated structure.

Since the light-emitting element 1 emits ultraviolet light in the UV-B wavelength range or the UV-C wavelength range as described above, AlGaN constituting the n-type semiconductor layer 11 has a high Al composition to reduce its absorption of short-wavelength ultraviolet light. The contact resistance between the n-type semiconductor layer 11 and the n-electrode 14 is high due to the high Al composition, and the area of the n-electrode 14 (a contact area with the n-type semiconductor layer 11) is thus preferably not less than 25% of the chip area of the light-emitting element 1 to avoid an increase in forward voltage. Since the chip area of the light-emitting element 1 is not less than 0.4 mm² and not more than 25 mm², the area of the n-electrode 14 is preferably not less than 0.1 mm².

On the other hand, the area of the n-electrode 14 is preferably not more than 50% of the chip area of the light-emitting element 1 since the areas of the p-electrodes 15 decrease with an increase in the area of the n-electrode 14 in the structure of the light-emitting element 1 and the decrease in the p-electrode area causes a decrease in the light-emitting area. Since the chip area of the light-emitting element 1 is not less than 0.4 mm² and not more than 25 mm², the area of the n-electrode 14 is preferably not more than 12.5 mm².

The p-electrodes 15 are arranged in a dot pattern. The p-electrode 15 may have the same layer structure as the n-electrode 14. In this case, the n-electrode 14 and the p-electrodes 15 can be formed simultaneously.

The n-pad electrode 16 is composed of a pad portion 16a and a via portion 16b and is arranged so that the via portion 16b is connected to the n-electrode 14. The n-pad electrode 16 has, e.g., a Ti/Ru/Au/Al laminated structure.

The p-connection electrode 17 is composed of a sheet portion 17a and plural via portions 17b and is arranged so that the via portions 17b are connected to the p-electrodes 15. The p-connection electrode 17 has, e.g., a Ti/Ru/Au/Al laminated structure.

The p-pad electrode 18 is composed of a pad portion 18a and a via portion 18b and is arranged so that the via portion 18b is connected to the sheet portion 17a of the p-connection electrode 17. The p-pad electrode 18 has, e.g., a Ti/Ru/Au/Al laminated structure.

In the light-emitting element 1 which emits short-wavelength ultraviolet light, the p-type semiconductor layers 13 absorb light emitted from the light-emitting layers 12 and generate a large amount of heat. It is preferable that the p-pad electrode 18 have a large area so that the heat generated by the p-type semiconductor layers 13 can be efficiently dissipated to the outside. For this reason, the p-pad electrode 18 may have a larger area than the n-pad electrode 16.

The insulation layer 19 is formed of an insulating material such as $SiO_2$.

FIG. 2A is a plan view showing an example of a pattern formed of the n-electrode 14 and the p-electrodes 15 in the light-emitting element 1. Illustrations of the n-pad electrode 16, the p-connection electrode 17, the p-pad electrode 18 and the insulation layer 19 are omitted in FIG. 2A.

Figure 2B:
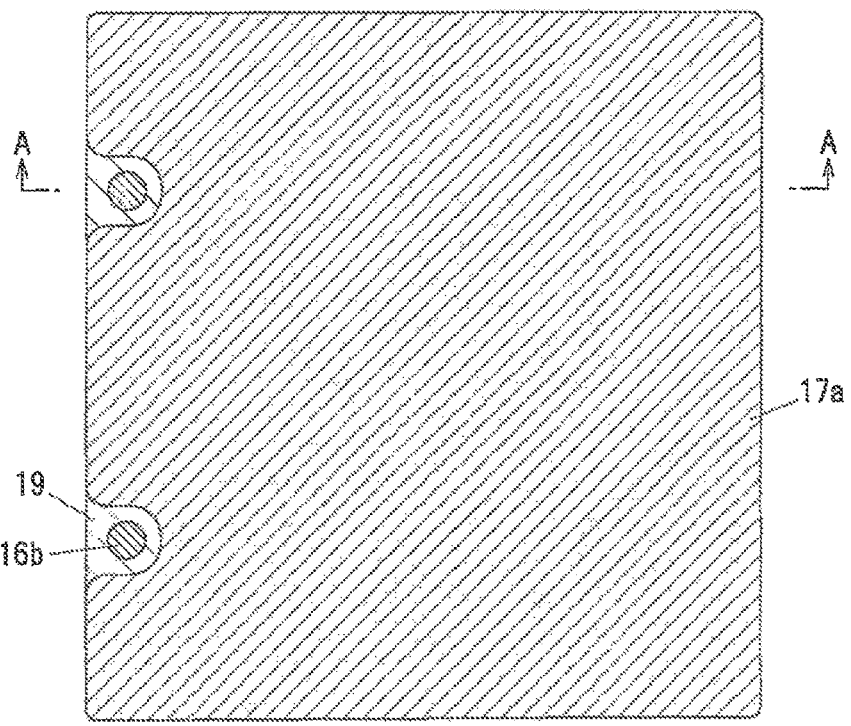
FIG. 2B is a horizontal cross-sectional view showing the light-emitting element taken along a layer including a sheet portion of a p-connection electrode.

FIG. 2B is a horizontal cross-sectional view showing the light-emitting element 1 taken along a layer including the sheet portion 17a of the p-connection electrode 17.

The vertical cross-section of the light-emitting element 1 in FIG. 1 is taken along line A-A in FIGS. 2A and 2B.

As shown in FIGS. 1, 2A and 2B, the plural p-electrodes 15 arranged in a dot pattern are connected to each other via the p-connection electrode 17.

Figure 3A:
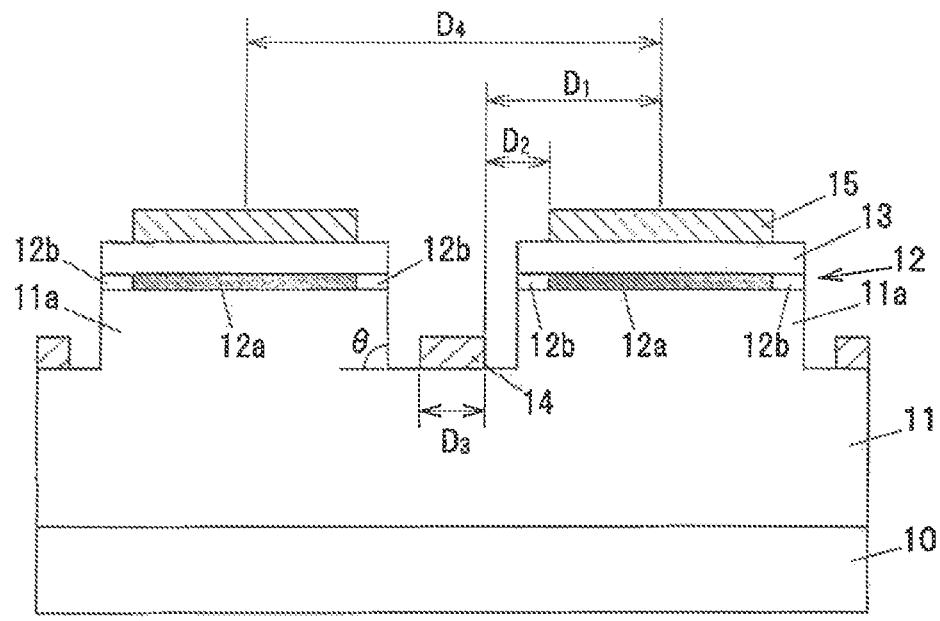
FIG. 3A is an explanatory diagram illustrating the positions and size of the p-electrodes of the light-emitting element in the embodiment.

FIG. 3A is an explanatory diagram illustrating the positions and size of the p-electrodes 15 of the light-emitting element 1. The vertical cross section in FIG. 3A is taken at the cutting position indicated by line B-B in FIG. 2A, at which a distance between adjacent p-electrodes 15 is the shortest.

A distance $D_1$ shown in FIG. 3A is a distance between an edge of the n-electrode 14 and the farthest point on the p-electrode 15 from the edge of the n-electrode 14. When the p-electrode 15 is, e.g., a circle, the distance $D_1$ is a distance from the edge of the n-electrode 14 to the center of the p-electrode 15.

Since the light-emitting element 1 emits ultraviolet light in the UV-B wavelength range or the UV-C wavelength range as described above, AlGaN constituting the n-type semiconductor layer 11 has a high Al composition to reduce its absorption of short-wavelength ultraviolet light. Accordingly, the n-type semiconductor layer 11 has a high sheet resistance and a portion of the light-emitting layer 12 actually emitting light is limited to a region close to the n-electrode.

In detail, in the light-emitting element 1 which emits ultraviolet light in the UV-B wavelength range or the UV-C wavelength range, a portion of the light-emitting layer 12 located more than 100 μm from the edge of the n-electrode 14 does not emit light or emits light with low intensity. Therefore, the distance $D_1$ is preferably set to not more than 100 μm.

To reduce the distance $D_1$ so as to prevent the light-emitting layer 12 from having a portion not sufficiently emitting light and to provide a sufficient light-emitting area, the p-electrode 15 needs to have a long circumferential length with respect to the area thereof. Arranging the plural p-electrodes 15 into a dot pattern allows the length of the circumferences of the plural p-electrodes 15 to be large with respect to the total area thereof.

In addition, the most preferable planar shape of each individual p-electrode 15 is a circle so that the length of the circumferences of the plural p-electrodes 15 can be large with respect to the area thereof. When the p-electrode 15 is a polygon, the number of vertices is preferably as large as possible.

Figure 3B:
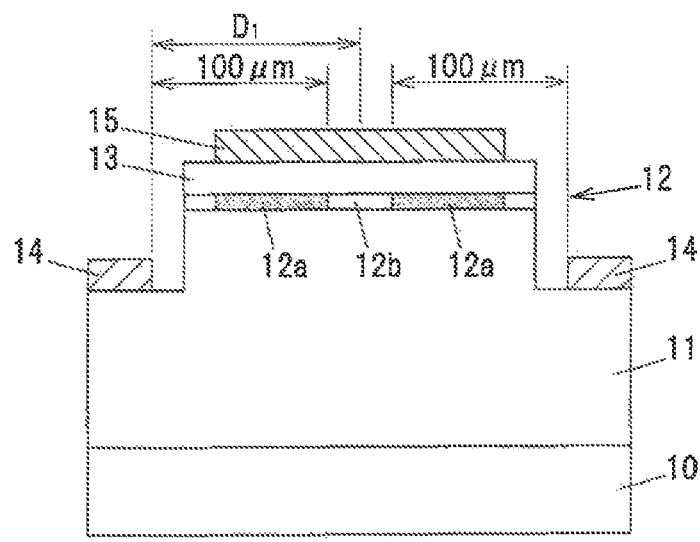
FIG. 3B is a diagram illustrating a structure around the p-electrode as Comparative Example in which a distance $D_1$ is greater than 100 µm.

FIG. 3B is a diagram illustrating a structure around the p-electrode 15 as Comparative Example in which the distance $D_1$ is greater than 100 μm. In FIGS. 3A and 3B, portions 12a of the light-emitting layer 12 emit light with sufficient intensity and portions 12b do not emit light or emits light with low intensity. As shown in FIG. 3B, a portion of the light-emitting layer 12 including the center does not sufficiently emit light when the distance $D_1$ is greater than 100 μm.

A distance $D_2$ shown in FIG. 3A is a (shortest) distance between the edge of the p-electrode 15 and the edge of the n-electrode 14, and the distance $D_2$ needs to be about 10 to 20 μm in view of positioning tolerance of the p-electrode 15 and the n-electrode 14 during manufacturing. A region between the p-electrode 15 and the n-electrode 14 is a region not producing light emission (hereinafter, referred to as "inactive region") and the distance $D_2$ can be regarded as a width of the inactive region. As shown in FIG. 3A, a portion of the light-emitting layer 12 not overlapping the p-electrode 15 is the portion 12b, e.g., a portion which does not emit light sufficiently.

Meanwhile, a distance $D_3$ is a width of the n-electrode 14 at a portion located between the centers of the closest adjacent p-electrodes 15.

A distance $D_4$ is defined as a distance between the centers of the most closely adjacent p-electrodes 15 or a pitch of the regularly arranged p-electrodes 15. Increasing the distance $D_4$ can increase the area of the n-electrode 14 formed between the p-electrodes 15, but reduces the total area of the p-electrodes 15. Therefore, the distance $D_4$ is set in the range of, e.g., not less than 80 μm and not more than 250 μm.

In order to provide a sufficient light-emitting area, the total area of the p-electrodes 15 is preferably not less than 45%, more preferably not less than 50%, of the chip area of the light-emitting element 1. Meanwhile, a radius or side length of each p-electrode 15 in the dot pattern is preferably not less than 50 μm and the total circumferential length of the p-electrodes 15 is preferably not less than 300 μm, so that the percentage of the inactive area can be not more than 20%. The percentage of the inactive area here is a percentage of the inactive region area relative to the chip area of the light-emitting element 1. The total circumferential length of the p-electrodes 15 is the sum of the circumferential lengths of all p-electrodes 15 in the dot pattern.

Meanwhile, in the light-emitting element 1, the n-type semiconductor layer 11 has raised portions 11a protruding from the surface connected to the n-electrode 14, and the light-emitting layers 12 and the p-type semiconductor layers 13 are laminated on the raised portions 11a. When a side surface of a laminated portion composed of the raised portion 11a of the n-type semiconductor layer 11, the light-emitting layer 12 and the p-type semiconductor layer 13 has a large inclination θ from a horizontal plane (a plane parallel to the principal surface of the substrate 10), the distance $D_2$ becomes long and the inactive region becomes large. Therefore, the inclination θ is preferably as close as 90°, and is preferably not less than 75° and not more than 90° in view of processing accuracy during manufacturing.

FIGS. 4A, 4B, 5A and 5B are plan views showing examples of the planar shape and layout pattern of the p-electrodes 15.

Figure 4A:
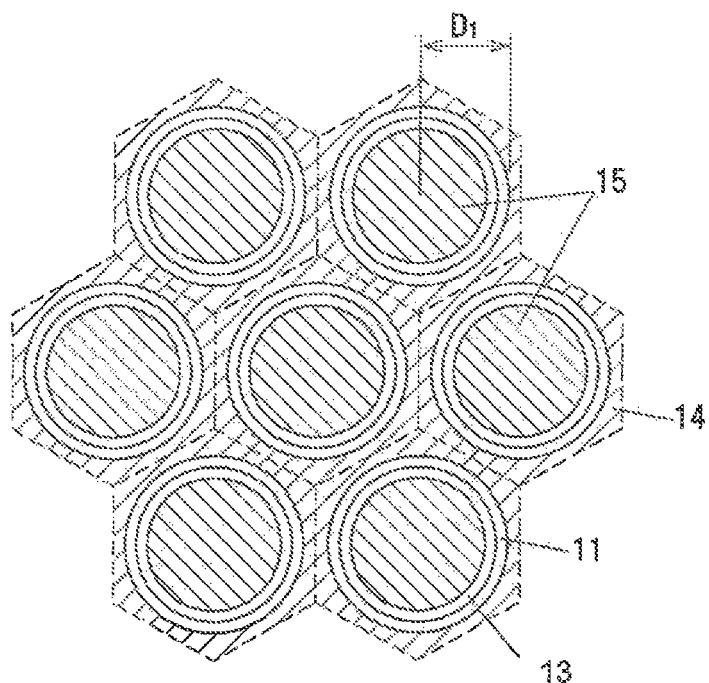
FIGS. 4A and 4B are plan views showing examples of the planar shape and layout pattern of the p-electrodes.

The p-electrodes 15 shown in FIG. 4A are circles and are arranged so that the centers of the circles form a hexagonal lattice to allow for high density arrangement.

Figure 4B:
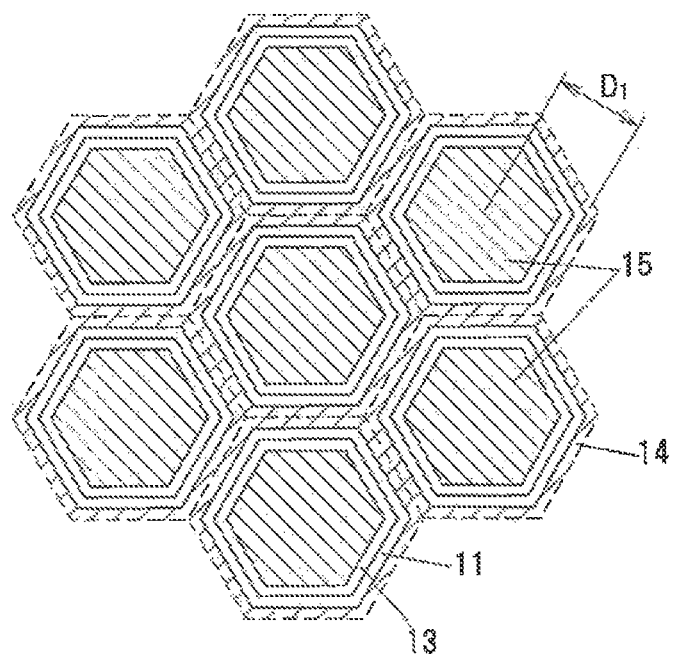

The p-electrodes 15 shown in FIG. 4B are hexagons and are arranged to orient in the same direction so that the centers of the hexagons form a hexagonal lattice to allow for high density arrangement.

Figure 5A:
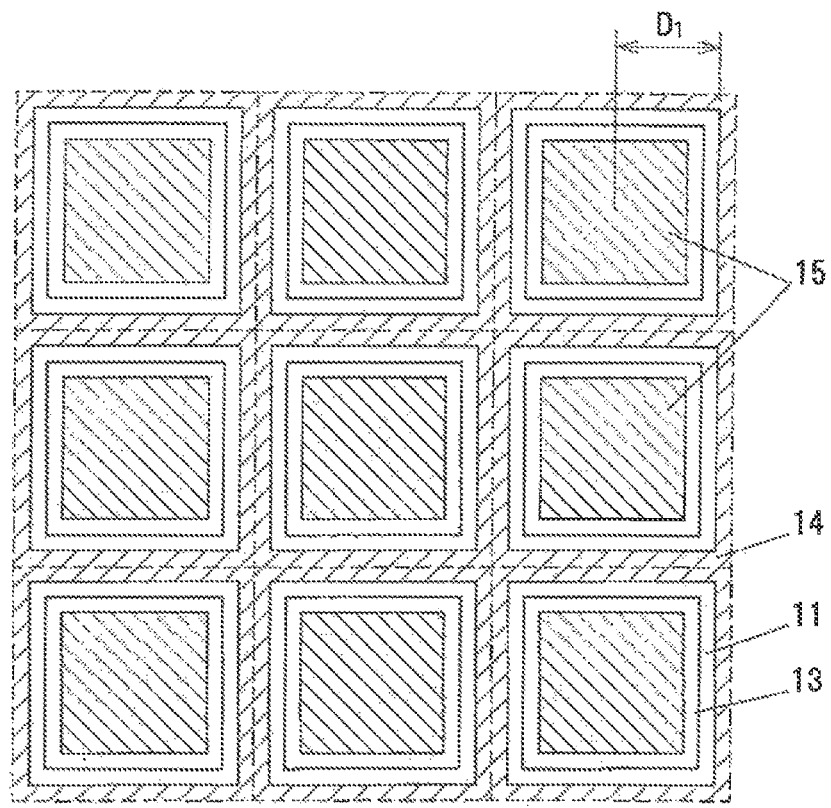
FIGS. 5A and 5B are plan views showing examples of the planar shape and layout pattern of the p-electrodes.

The p-electrodes 15 shown in FIG. 5A are squares and are arranged to orient in the same direction so that the centers of the squares form a square lattice to allow for high density arrangement.

Figure 5B:
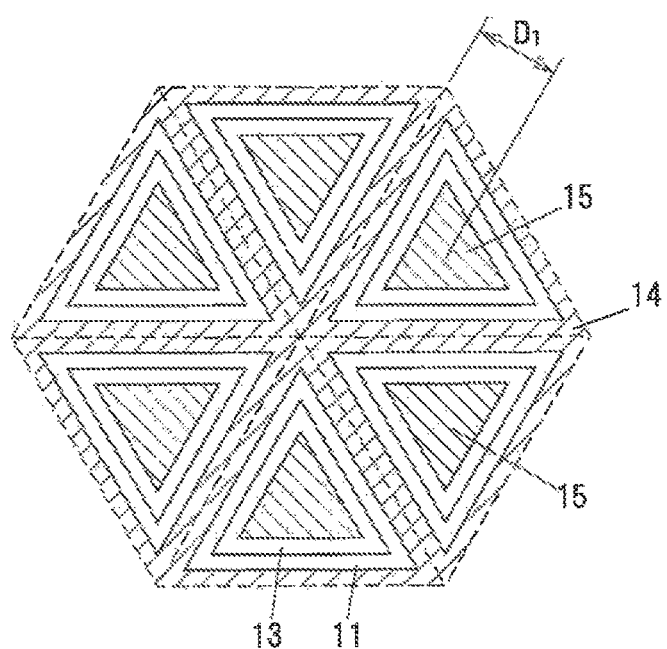

The p-electrodes 15 shown in FIG. 5B are triangles and are arranged so that adjacent triangles are oriented 180 degrees from each other and the centers of the triangles form a honeycomb lattice to allow for high density arrangement.

To increase the light-emitting area by increasing the area of the p-electrodes 15 with respect to the area of the inactive region, the planar shape of the p-electrode 15 is preferably a circle or a polygon with not less than four vertices, and is particularly preferably a circle or a hexagon. For high density arrangement of the p-electrodes 15, the circle is preferably a true circle and the polygon is preferably a regular polygon.

Figure 6:
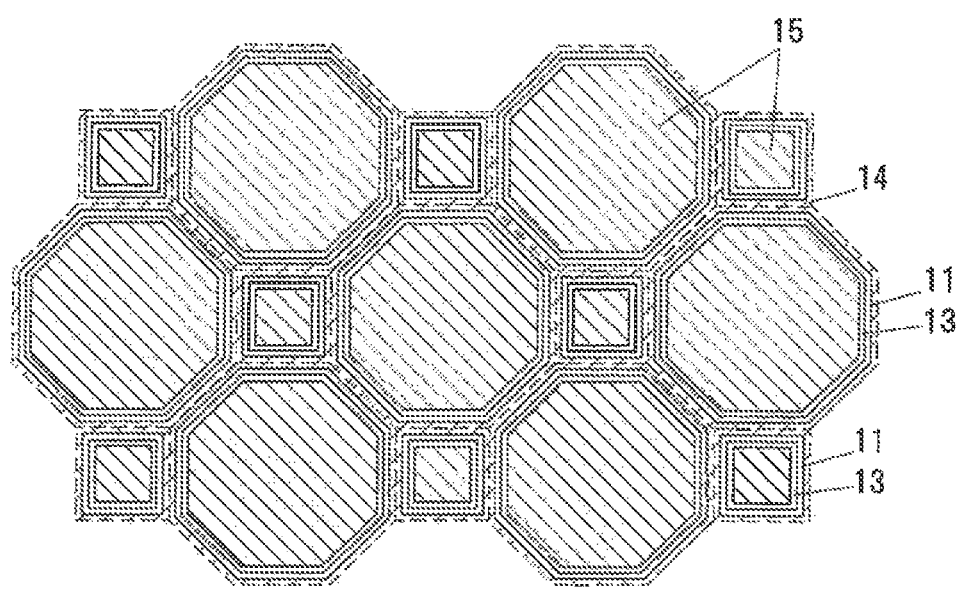
FIG. 6 is a plan view showing an example in which the light-emitting element has plural types of p-electrodes with different planar shapes.

FIG. 6 is a plan view showing an example in which the light-emitting element 1 has plural types of p-electrodes 15 with different planar shapes. In the example shown in FIG. 6, square p-electrodes 15 and octagonal p-electrodes 15 are arranged. As such, the light-emitting element 1 may have plural types of p-electrodes 15 having different planar shapes. Alternatively, for example, two types of circular p-electrodes 15 having different diameters may be arranged, or square p-electrodes 15 and rectangular p-electrodes 15 may be arranged.

Effects of the Embodiment

In the embodiment, by using plural p-electrodes 15 arranged in a dot pattern in the light-emitting element 1 which emits short-wavelength ultraviolet light, it is possible to provide a sufficient light-emitting area by preventing a decrease in light emission efficiency due high sheet resistance of the n-type semiconductor layer 11 and it is also possible to prevent an increase in forward voltage of the light-emitting element 1 by providing the n-electrode 14 with a sufficient area.

EXAMPLES

An effect of the shape and size of the p-electrode 15 on the characteristics of the light-emitting element 1 in the embodiment was examined by simulation.

FIG. 7A is a graph showing a relation between a percentage of the area of the p-electrodes 15 and a radius (in case of circle) or side length (in case of polygon) of each p-electrode 15 in the dot pattern. The percentage of the area of the p-electrodes 15 here is a percentage of the total area of the p-electrodes 15 relative to the chip area of the light-emitting element 1.

FIG. 7B is a graph showing a relation between a percentage of the area of the n-electrode 14 and a radius (in case of circle) or side length (in case of polygon) of each p-electrode 15 in the dot pattern. The percentage of the area of the n-electrode 14 here is a percentage of the area of the entire n-electrode 14 relative to the chip area of the light-emitting element 1.

FIG. 7C is a graph showing a relation between a percentage of the inactive area and a radius (in case of circle) or side length (in case of polygon) of each p-electrode 15 in the dot pattern.

FIGS. 7A, 7B and 7C show the calculation results when the p-electrodes 15 are true circles, regular hexagons, squares and equilateral triangles. The layout patterns when the p-electrodes 15 are true circles, regular hexagons, squares and equilateral triangles are the same as those shown in FIGS. 4A, 4B, 5A and 5B. In this calculation, the radius (in case of circle) or side length (in case of polygon) of each p-electrode 15 in the dot pattern was changed while the distance $D_2$ was fixed to 10 μm and the distance $D_3$ to 15 μm. The distances $D_1$ and $D_4$ changed with the change in the radius or side length of the p-electrode 15 in the dot pattern.

As shown in FIG. 7A, the percentage of the area of the p-electrodes 15 with respect to the radius or side length of the p-electrode 15 in the dot pattern was the largest when using the hexagonal p-electrodes 15 and was the second largest when using the circular p-electrodes 15.

On the other hand, since the area of the n-electrode 14 decreases with an increase in the area of the p-electrodes 15, the percentage of the area of the n-electrode 14 with respect to the radius or side length of the p-electrode 15 in the dot pattern was the smallest when using the hexagonal p-electrodes 15 and was the second smallest when using the circular p-electrodes 15.

Meanwhile, the percentage of the inactive area with respect to the radius or side length of the p-electrode 15 in the dot pattern was particularly large when using the triangular p-electrodes 15, and there is no significant difference between the circular, hexagonal and square triangular p-electrodes 15. To provide a sufficient light-emitting area, the percentage of the inactive area is preferably not more than 20%, and for this reason, the radius or side length of each p-electrode 15 in the dot pattern is preferably not less than 50 μm.

Figure 8:
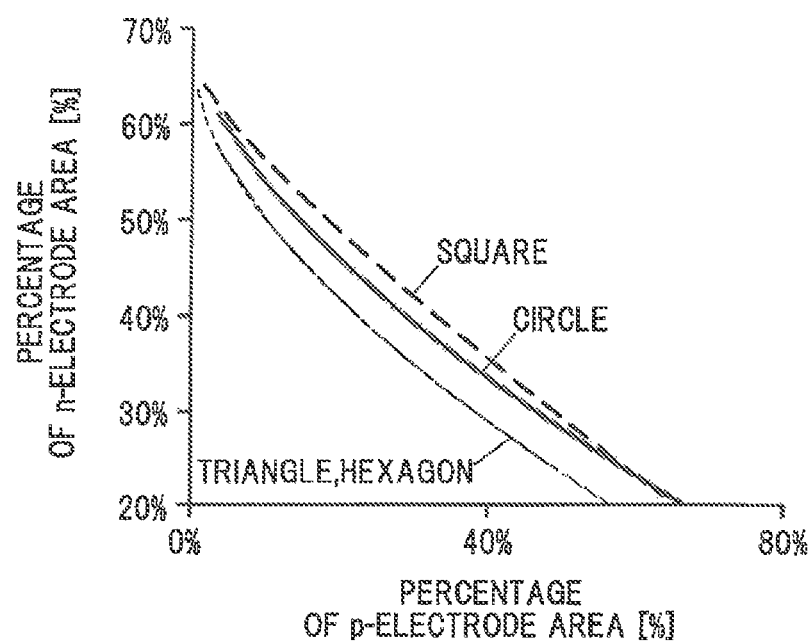
FIG. 8 is a diagram graphically illustrating a relation between the percentage of p-electrode area and the percentage of n-electrode area based on the data of FIGS. 7A and 7B.

FIG. 8 is a diagram graphically illustrating a relation between the percentage of the area of the p-electrodes 15 and the percentage of the area of the n-electrode 14 based on the data of FIGS. 7A and 7B. FIG. 8 shows that when the percentage of the area of the p-electrodes 15 is the same, the percentage of the area of the n-electrode 14 is larger when using the circular p-electrodes 15 than when using the hexagonal p-electrodes 15. Therefore, to reduce forward voltage of the light-emitting element 1, the planar shape of the individual p-electrode 15 is preferably a circle.

Figure 9A:
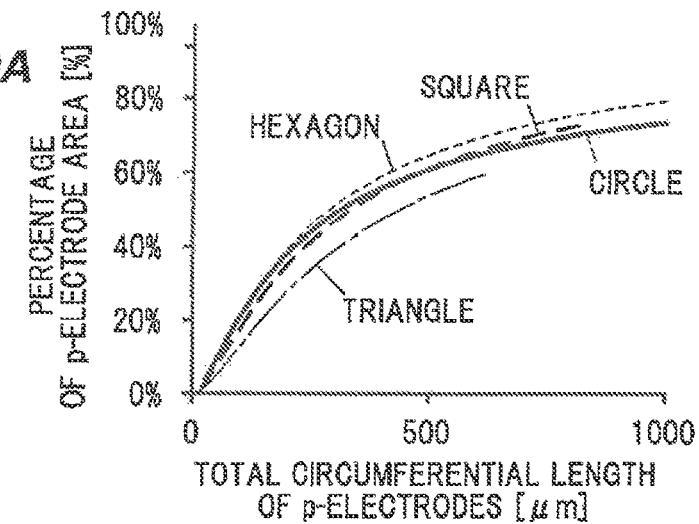
FIGS. 9A, 9B and 9C are diagrams based on the data in FIGS. 7A, 7B and 7C and respectively showing the relation with respect to the total circumferential length of the p-electrodes, instead of with respect to the radius or side length of each p-electrode in the dot pattern.
Figure 9B:
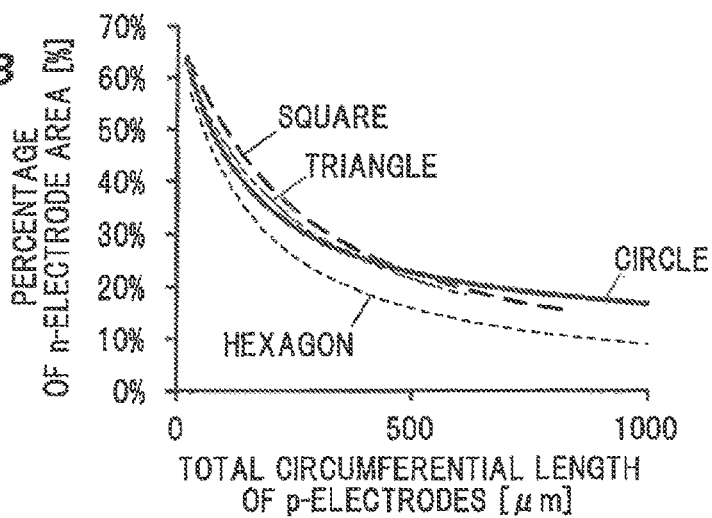
Figure 9C:
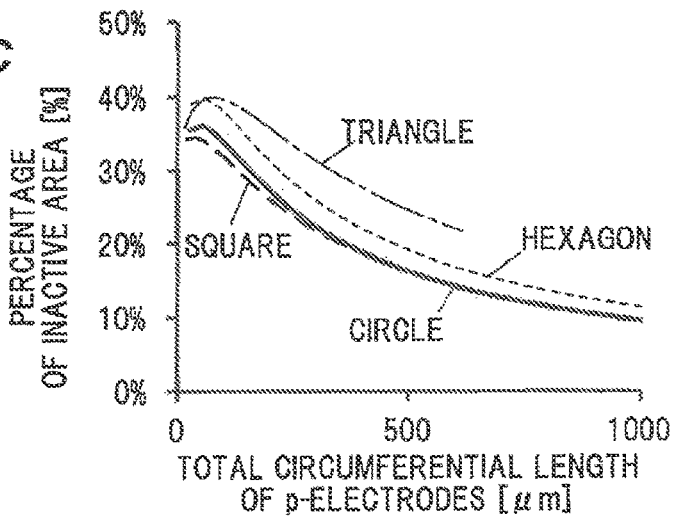

FIGS. 9A, 9B and 9C are diagrams based on the data in FIGS. 7A, 7B and 7C and respectively showing the relation with respect to the total circumferential length of the p-electrodes 15, instead of with respect to the radius or side length of the p-electrode 15 in the dot pattern.

FIGS. 9A, 9B and 9C show the similar tendency to FIGS. 7A, 7B and 7C such that, for example, the percentage of the area of the p-electrodes 15 with respect to the total circumferential length of the p-electrodes 15 is the largest when using the hexagonal p-electrodes 15, and the percentage of the area of the n-electrode 14 with respect to the total circumferential length of the p-electrodes 15 is the smallest when using the hexagonal p-electrodes 15.

In addition, since the percentage of the inactive area is preferably not more than 20% as described above, the length of the circumferences of the p-electrodes 15 is preferably not less than 300 μm based on FIG. 9C.

Based on the results shown in FIGS. 7A to 7C, 8 and 9A to 9C, the planar shape of the individual p-electrode 15 is preferably a circle or a hexagon.

Although the embodiment and examples of the invention have been described, the invention is not intended to be limited to the embodiment and examples, and the various kinds of modifications can be implemented without departing from the gist of the invention.

In addition, the invention according to claims is not to be limited to the embodiment and examples. Further, please note that all combinations of the features described in the embodiment and examples are not necessary to solve the problem of the invention.

What is claimed is:

1. A light-emitting element, comprising:
   an n-type semiconductor layer mainly comprising $Al_xGa_{1-x}N$ (0.5≤x≤1);
   a p-type semiconductor layer;
   a light-emitting layer sandwiched between the n-type semiconductor layer and the p-type semiconductor layer;
   an n-electrode connected to the n-type semiconductor layer;
   a plurality of protrusions comprising the n-type semiconductor layer, the p-type semiconductor layer and the light-emitting layer; and
   a plurality of p-electrodes that are connected to the p-type semiconductor layers on the plurality of protrusions and are arranged in a dot pattern,
   wherein an area of the n-electrode is not less than 25% and not more than 50% of a chip area.

2. The light-emitting element according to claim 1, wherein the n-type semiconductor layer mainly comprises $Al_xGa_{1-x}N$ (x≥0.65).

3. The light-emitting element according to claim 1, wherein a distance between an edge of the n-electrode and a farthest point on the p-electrodes from the edge of the n-electrode is not more than 100 μm.

4. The light-emitting element according to claim 1, wherein an area of the p-electrodes is not less than 45% of the chip area.

5. The light-emitting element according to claim 1, wherein a planar shape of the p-electrode comprises a circle or a polygon with not less than four vertices.

6. The light-emitting element according to claim 5, wherein the planar shape of the p-electrode comprises a circle or a hexagon.

7. The light-emitting element according to claim 1, wherein a radius when having a circular shape, or a side when having a polygonal shape, of each p-electrode in the dot pattern is not less than 50 μm.

8. The light-emitting element according to claim 1, wherein a total circumferential length of the p-electrodes is not less than 300 μm.

9. The light-emitting element according to claim 1, wherein the light-emitting layer and the p-type semiconductor layer are laminated on a raised portion of the n-type semiconductor layer that protrudes from a surface connected to the n-electrode, and
   wherein a side surface of a laminated portion comprising the raised portion of the n-type semiconductor layer, the light-emitting layer and the p-type semiconductor layer is inclined at an angle of not less than 75° and not more than 90°.

10. The light-emitting element according to claim 1, wherein the plurality of p-electrodes are connected to the p-type semiconductor layers on the plurality of protrusions and are arranged in the dot pattern such that the light emitting element comprises a monolithic structure.

11. The light-emitting element according to claim 1, wherein the plurality of protrusions are arranged with the n-electrode located therebetween.

12. The light-emitting element according to claim 1, wherein the light-emitting element is formed as a monolithic structure.

13. The light-emitting element according to claim 1, wherein the plurality of protrusions are formed on a single chip.

14. The light-emitting element according to claim 2, wherein the n-type semiconductor layer mainly comprises $Al_xGa_{1-x}N$ (0.65≤x≤0.7).

15. The light-emitting element according to claim 1, wherein an area of the p-electrodes is greater than an area of the n-electrode.

16. The light-emitting element according to claim 1, wherein the n-type semiconductor layer includes raised portions protruding from a surface connected to the n-electrode, and
    wherein the light-emitting layer and the p-type semiconductor layer are laminated on the raised portions.

17. The light-emitting element according to claim 1, wherein a side length of each p-electrode in the dot pattern is not less than 50 μm, and
    wherein a total circumferential length of the p-electrodes is not less than 300 μm so that a percentage of an inactive area is not more than 20%.

18. A light-emitting element, comprising:
    an n-type semiconductor layer mainly comprising $Al_xGa_{1-x}N$ (0.5≤x≤1);
    a p-type semiconductor layer;
    a light-emitting layer sandwiched between the n-type semiconductor layer and the p-type semiconductor layer;
    an n-electrode connected to the n-type semiconductor layer;
    a plurality of protrusions comprising the n-type semiconductor layer, the p-type semiconductor layer and the light-emitting layer; and
    a plurality of p-electrodes that are connected to the p-type semiconductor layers on the plurality of protrusions and are arranged in a dot pattern,
    wherein a distance between an edge of the n-electrode and a farthest point on the p-electrodes from the edge of the n-electrode is not more than 100 μm.

19. The light-emitting element according to claim 18, wherein the n-type semiconductor layer includes raised portions protruding from a surface connected to the n-electrode, and
    wherein the light-emitting layer and the p-type semiconductor layer are laminated on the raised portions.

20. The light-emitting element according to claim 18, wherein a side length of each p-electrode in the dot pattern is not less than 50 μm, and wherein a total circumferential length of the p-electrodes is not less than 300 µm so that a percentage of an inactive area is not more than 20%.

* * * * *